(12) United States Patent
Gray

(10) Patent No.: US 6,870,089 B1
(45) Date of Patent: Mar. 22, 2005

(54) SYSTEM AND APPARATUS FOR CHARGING AN ELECTRONIC DEVICE USING SOLAR ENERGY

(76) Inventor: Randolph Dean Gray, 16721 Chamonix Ter., Round Rock, TX (US) 78681

( * ) Notice: Subject to any disclaimer, the term of this patent is extended or adjusted under 35 U.S.C. 154(b) by 0 days.

(21) Appl. No.: 10/292,248

(22) Filed: Nov. 12, 2002

(51) Int. Cl.[7] .............................................. H01L 31/48
(52) U.S. Cl. ....................... 136/251; 136/244; 136/245; 136/291; 136/203; 136/200; 62/3.2; 62/3.6; 62/3.62; 224/153
(58) Field of Search ................................ 136/251, 244, 136/291, 203, 200, 245; 62/3.2, 3.6, 3.62; 224/153

(56) References Cited

U.S. PATENT DOCUMENTS

| | | | |
|---|---|---|---|
| 5,522,943 A | * 6/1996 | Spencer et al. | 136/245 |
| 5,701,067 A | * 12/1997 | Kaji et al. | 320/101 |
| 5,855,692 A | 1/1999 | Kaji et al. | 136/245 |
| 6,024,264 A | 2/2000 | Java | 224/576 |
| 6,281,425 B1 | 8/2001 | Price | 136/244 |
| 2002/0158602 A1 | * 10/2002 | McNair, Jr. | 320/107 |

FOREIGN PATENT DOCUMENTS

| | | | |
|---|---|---|---|
| DE | 3314251 A1 | * | 10/1984 |
| JP | 7-327725 A | * | 12/1995 |
| JP | 9-18042 A | * | 1/1997 |
| JP | 10-146213 A | * | 6/1998 |
| JP | 11-299528 A | * | 11/1999 |

OTHER PUBLICATIONS

Product Description for the "iSun charger" and "iSun-Catcher sport" products, date unknown.
Product Description for the "Diogenes—Sundance Solar" product, date unknown.
Product Description for the "Solar Power Pack—Solardyne Corp" product, date unknown.

* cited by examiner

Primary Examiner—Alan Diamond
(74) Attorney, Agent, or Firm—Kevin R. Imes

(57) ABSTRACT

A system and apparatus for charging an electronic device using solar energy are disclosed. In one form, a portable storage apparatus operable to charge a battery associated with an electronic device is disclosed. The apparatus includes a first material configured to provide a storage space for storing articles. The storage space includes an interior portion and an exterior portion. The apparatus further includes a first flexible solar panel coupled to an exterior portion of the portable storage apparatus and integrated as a part of the first material. A second positional solar panel is also provided and coupled to an interior portion of the portable storage apparatus. The apparatus further includes a universal 12-volt charge port coupled to the first and second solar panels and operable to receive a charge conductor for charging the electronic device.

24 Claims, 10 Drawing Sheets

SYSTEM AND APPARATUS FOR CHARGING AN ELECTRONIC DEVICE USING SOLAR ENERGY

TECHNICAL FIELD

The present invention generally relates to energy consumption and, more particularly, to a system and apparatus for charging an electronic device using solar energy.

BACKGROUND OF THE INVENTION

Power utilization of conventional hand-held electronic devices vary significantly depending on the application and use of the device. Some electronic devices include reduced power states that draw very little power when the electronic device is not in use. For example, a handheld computing device uses significantly more energy to process user inputs and display information within user interfaces such as thin film transistor active matrix displays (TFT displays). When the handheld computing device is not being used, it is placed in an off mode, sleep mode or other reduced power state to decrease or reduce power consumption.

Other electronic devices, such as some conventional cellular telephones, consume energy based on a user's interaction with a wireless network. For example, some conventional cellular telephones include off positions, standby modes for receiving phone calls or other incoming data services, and active modes for interacting with wireless networks to place and receive phone calls or requesting data services. Each mode of operation may have separate power demands or requirements.

Advancements in wireless networks may also increase power utilization of some electronic devices. For example, as cellular phones and handheld computing devices migrate to high-speed wireless networks, power consumption of electronic devices may increase as a function of communicating and processing data via high-speed communication networks. This may result in more frequent charging of electronic devices.

SUMMARY OF THE INVENTION

In accordance with teachings of the invention, a system and apparatus for charging an electronic device using solar energy are provided. According to one aspect of the invention, a portable storage apparatus for charging an electronic device is disclosed. The portable storage apparatus includes at least one solar panel integrated as a part of an exterior surface of a storage apparatus operable to store an electronic device an a conductive element electrically coupled between the at least one solar panel and a charge port. The charge port is operable to couple converted solar energy to charge a rechargeable battery of the electronic device.

According to another aspect of the invention, a portable solar charge system for charging an energy source associated with an electronic device is disclosed. The portable solar charge system includes a first solar panel securely coupled to an external portion of a storage apparatus and a second positional solar panel coupled to a portion of the storage apparatus. The system further includes at least one charge port electrically coupled to at least one of the first and second solar panels and operable to interface a conductive element to provide converted solar energy to charge the energy source.

According to a further aspect of the invention, a backpack operable to charge a battery associated with an electronic device is disclosed. The backpack includes a storage space for storing an electronic device wherein the storage space includes an interior portion and an exterior portion. The backpack further includes a first flexible solar panel integrated as a part of the exterior portion of the portable storage apparatus and a second positional solar panel coupled to an interior portion of the backpack. The backpack further includes a universal twelve-volt charge port electrically coupled to the first and second solar panels. The universal twelve-volt charge port is operable to actively provide solar energy to charge the electronic device while the backpack is used within a mobile environment.

It is an object of the invention to provide an environmental friendly alternative energy resource for charging electronic devices.

It is another object of the invention to provide a portable charging system for electronic devices.

It is a further object of the invention to provide an efficient method to charge an electronic device in a mobile environment without requiring the use of conventional terrestrial energy sources.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Advantageous embodiments of the invention are illustrated in FIGS. 1–9 and provide environmentally conscious alternatives for charging batteries associated with electronic devices. In one form, solar energy is converted into a direct current voltage and/or current for charging electronic devices such as cellular phones, personal digital assistants, personal computing devices, digital cameras, digital video recorders, music players, laptop computers or other portable electric devices such as cordless screw drivers, cordless drills, or other rechargeable cordless power tools or devices. Portable storage apparatuses for use in mobile environments are disclosed and include solar charge systems to actively charge rechargeable batteries associated with electronic devices stored within the a storage apparatus. A solar charge system includes a solar panel or solar photovoltaic module integrated as a part of the portable storage apparatus to actively convert solar energy to electrical energy sufficient to charge the electronic device stored within the portable storage apparatus. In this manner, a portable storage apparatus may be used in a mobile environment to actively charge electronic devices obviating the need to use conventional or terrestrial energy sources.

In a particularized form, a portable storage apparatus includes a backpack for storing articles and use within a mobile environment. The backpack includes at least one solar panel or photovoltaic module integrated as a part of an exterior surface of the backpack. Storage space is provided internal to the backpack for storing an electronic device and includes a universal twelve-volt charge port for receiving a charge accessory operably associated with coupling direct current energy to the electronic device to charge a battery associated with the electronic device. The portable storage apparatus allows for active charging of the electronic device as the backpack is used within a mobile environment providing efficient use of both the backpack and the solar charge system.

Solar panels and photovoltaic modules may be used interchangeably throughout the detailed description and should be viewed generally as solar energy converting devices operable to convert solar energy into electrical energy. As such, solar panels, solar modules, and photovoltaic modules may be used interchangeably throughout the description and should not be viewed in a limiting sense and may be operable to produce one or more levels of power. For example, a solar panel module may be used to produce several watts of power at several different voltage and current levels (i.e. 2.2 Watts at 7.6 volts and 290 milliamps, 2–12 Volt levels, 300 Watts, etc.) sufficient to charge an electronic device. Additionally, each solar panel or solar panel module may include at least two conductive elements (i.e. positive and negative reference terminals) for direct current power provided by using solar energy to an output port. As such, conductors or conductive elements are disclosed without showing each specific terminal and may be realized as multiple conductors or conductive elements, conductor pairs for coupling direct current, or other conductors as needed for coupling energy between components, output ports, receptacles, etc.

Figure 1:
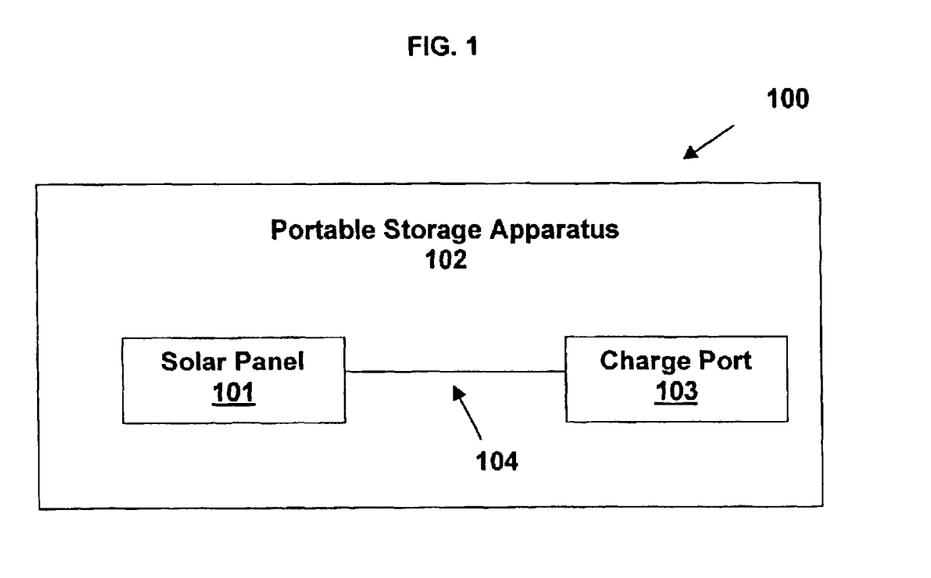
FIG. 1 illustrates a block diagram of a portable storage apparatus having an integrated solar charge system according to one aspect of the invention.

FIG. 1 illustrates a block diagram of a portable storage apparatus having an integrated solar charge system according to one aspect of the invention. Solar charge system, illustrated generally at 100, includes at least one solar panel 101 operable to receive solar energy and convert solar energy into a direct current voltage or current. Solar panel 101 may be integrated as a part of an exterior portion of portable storage apparatus 102 providing continuos access to solar energy in mobile environments. Solar panel 101 may include a rigid solar panel such as a fifty watt twelve-volt solar panel module manufactured by Astropower may be used. In another embodiment, solar panel 101 may include a flexible solar panel integrated as a portion of portable storage apparatus 100. For example, a flexible solar panel manufactured by Unisolar may be integrated as a part of an outer surface of portable storage apparatus 100 and may be a thirty-two watt twelve-volt power sources. Flexible solar panels advantageously allow for increased durability and use of a portable storage apparatus 100 in a mobile environment and include flexible light-weight cells coupled to flexible stainless steel sheet of material. Several different types of solar energy panels may be used to output energy as needed and may be operable to output several different levels of energy (i.e. five watts, ten watts, 25 watts, 50 watts, etc.) sufficient to charge an electronic device.

Solar panel 101 is integrated as a part of an exterior portion of a portable storage apparatus 102 operable to store articles for use in a portability or mobile environment. Solar panel may be integrated as a part of an exterior surface depending on the type of apparatus and application of portable storage apparatus 100. For example, solar panel 101 may be integrated as a part of a fabric and sewn or bonded to a specific area, inset within a molded portion and held in place with a bonding or adhesive material or coupling mechanisms such as screws, nuts, etc. Charge port or port 103 is coupled to solar panel 101 via conductive element 104 operable to provide an electrical connection for charging an electric device coupled to charge port 103 (not expressly shown).

Though illustrated as a single solar panel, it should be understood that solar panel 101 may include several solar panels integrated as a part of storage apparatus 100 and as a part of solar charge system 101 and may include several combinations of flexible and/or rigid solar panels integrated as a part of portable storage apparatus 100 internal and/or external to portable storage apparatus 100.

During use, solar charge system 100 receives and converts solar energy into direct current energy for charging a battery associated with an electronic device. For example, solar panel 101 may convert solar energy to provide a fifty-watt output and provides the converted energy to charge port 103 operable to coupled the converted solar energy to an electronic device such as a GPS unit, PDA, digital music player, cell phone, CD player, cassette player, digital camera, portable scanner or copier, or other electronic or electric power tools such as cordless drills, screwdrivers, saws, etc. For example, solar panel 100 may provide a minimum output sufficient to charge an electronic device. In another embodiment, a device specific charge circuit (not expressly shown) may include electronic components configured to convert the energy output from solar panel 100 to a specific level based on a charge specification of the electronic device. For example, the charge circuit may include one or more resistive elements configured to reduce the energy level to a level sufficient to charge the electronic device. Additionally, other devices such as current limiting devices such as fuses and blocking diodes may be provided to safely charge the electronic device without risking damage or depleting energy within the electronic device. For example, a blocking diode may be used to eliminate reverse current conditions that may deplete energy stored within a rechargeable battery and/or electronic device. A blocking diode may be provided between solar panel 101 and charge port 103 to obviate undesired reverse current conditions. In one embodiment, a device specific charge port may also be provided and may include one or more specific contact or conductive elements positioned to interface the electronic device to charge the electronic device. As such, storage apparatus 100 may include device specific configurations to accommodate charging a specific electronic device.

Solar charge system 100 is incorporated as a portion of portable storage apparatus 102 and includes solar panel 101 integrated as a part of storage apparatus 102 to provide an active system for charging an electronic device. Solar panel 101 integrated as a part of a storage apparatus 102 obviates the need to couple a solar panel accessory to an electronic device and provides for both charging and storage of the electronic device. For example, solar charge system 100 integrated as a part of storage apparatus 102 advantageously allows a user to be mobile obviating the need to set up non-mobile solar charge systems or use conventional or terrestrial energy sources to charge electronic devices. Additionally, through integrating solar panel 101 as a part of storage apparatus 102, undesired damage caused from jarring a solar panels that extend beyond a surface of storage apparatus 102 may be avoided adding to increased durability, use, and longevity of the solar charge system 100.

Figure 2:
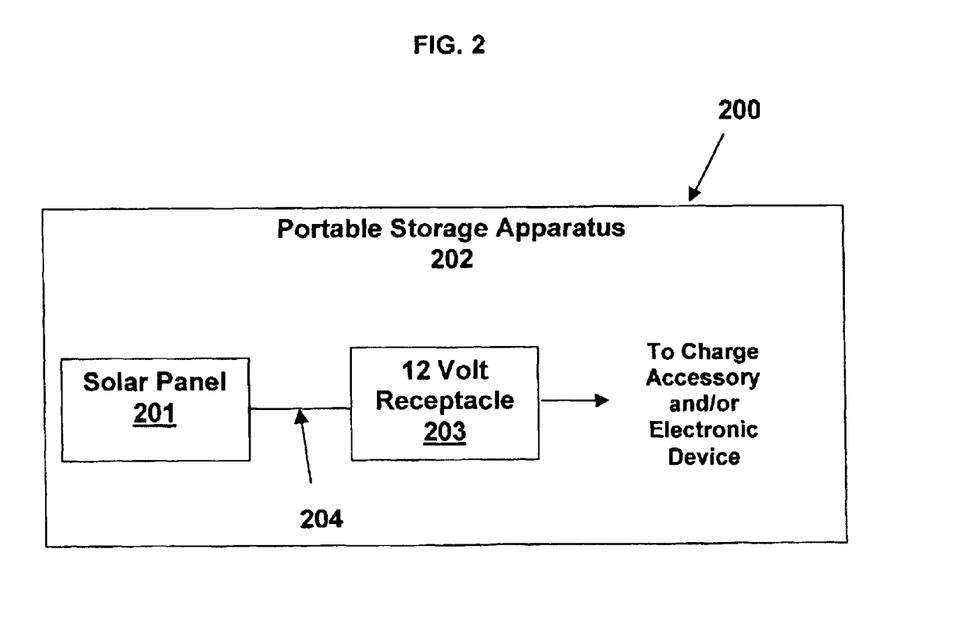
FIG. 2 illustrates a block diagram of a portable storage apparatus having a solar charge system incorporating a universal charge port according to one aspect of the invention.

FIG. 2 illustrates a block diagram of a portable storage apparatus having a solar charge system incorporating a universal charge port according to one aspect of the invention. Solar charge system 200 includes a first solar panel 201 integrated as a part of portable storage apparatus 202. Solar charge system 200 includes a universal twelve-volt charge port 203 coupled to solar panel 201 via conductor 204 and operable to couple a universal twelve-volt plug and charge adapter or accessory to port 203. For example, some electronic devices may be charged using a universal twelve-volt charge adapter. As such, solar charge system 200 including universal twelve-volt charge port 201 advantageously allows for use of conventional charge accessories that convert and/or couple direct current power to charge electronic devices. In this manner, portable storage apparatus 202 may not require additional device specific charge circuitry and may allow for several different types of charge accessories for specific electronic devices to be used in association with portable storage apparatus 200 allowing for several different electronic devices to be charged using converted solar energy provided by solar charge system 201.

Figure 3:
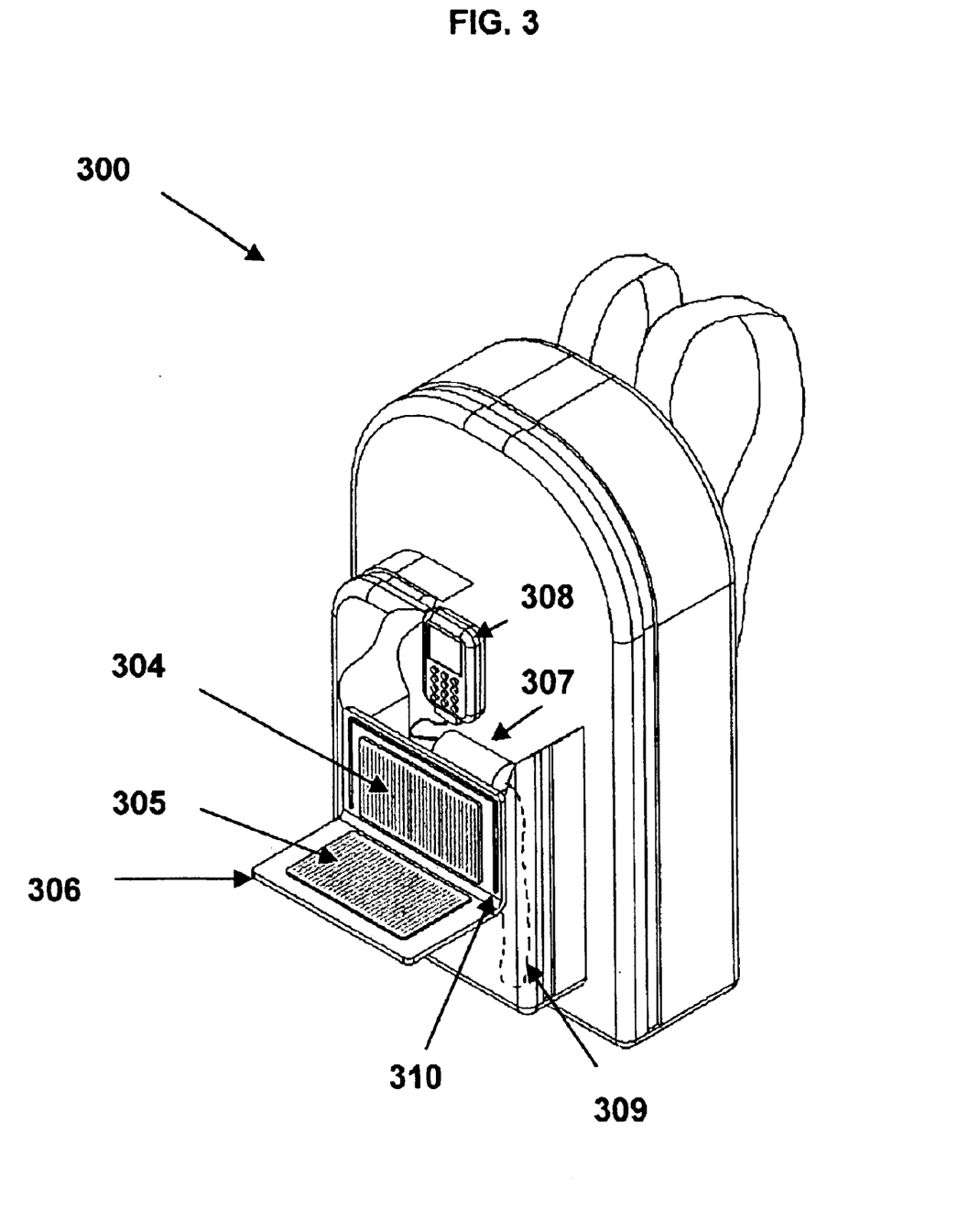
FIG. 3 illustrates a portable storage apparatus incorporating a solar charge system for charging an electronic device according to one aspect of the invention.

FIG. 3 illustrates a portable storage apparatus incorporating a solar charge system for charging an electronic device according to one aspect of the invention. A portable storage apparatus, illustrated as backpack 300, includes a positional solar panel holder 306 integrated as a part of an exterior portion of backpack 300 and securely holding a first solar panel 304 and a second solar panel 305. For example, solar panel holder 306 may include a fabric material substantially similar to backpack 300 and operable hold solar panels 304 and 305 in place. For example, solar panel holder 306 may include cavity (not expressly show) as a part of solar panel holder 306 and a durable optically transparent material stitched over each solar panel to hold each solar panel in place. Additionally, padding material may be provided as a backing behind each solar panel holder to reduce mechanical shock that may occur during use. As such, through integrating each solar panel as a part of an exterior portion of backpack 300, undesired damage that may occur though coupling solar panels to an external surface of a backpack or storage apparatus may be reduced.

Positional solar panel holder 306 may be lowered or raised depending on the desired use of backpack 300. For example, when positional solar panel holder 306 is lowered first and second solar panels 304 and 305 are used to charge an electronic device. However, when a user does not desire to use first and second solar panels 304 and 305, Positional solar panel may be raised and coupled to a portion of backpack 300 using coupling element 310. Additionally, a third solar panel may be integrated as a part of an opposing side of solar panel holder 306 (not expressly shown) and operable to convert solar energy when solar panel holder 306 is in a raised position. Additionally, one or more coupling mechanisms may be used to secure positional solar panel holder 306 using coupling element 306. For example, coupling element 310 may include a zipper, hook and loop material, snaps, buttons, clasps, or other fastening mechanisms for securing positional solar panel holder 306 in a closed position.

Backpack 300 further includes a charge port 307 electrically coupled to solar panels 304 and 305 to facilitate charging an electronic device 308. Charge port 307 is coupled to an interior portion of backpack 300 allowing for storage of electronic device 308 within backpack 300 while allowing a user to charge electronic device 308 while backpack 300 is used in mobile environments. In one embodiment, charge port 307 (or an additional charge port) may be externally accessed. For example, charge port 307 may be located along a side portion of backpack 300 and accessible external to backpack 300 allowing a user to charge electronic device 308 without storing electronic device 308 within backpack 300. For example, an electronic device, such as a cellular telephone, may coupled to an external accessible charge port allowing a user to use the cellular telephone while the cellular telephone receives a charge from solar panels 304 and 305.

In one embodiment, charge port 307 may include a universal charge port for coupling a charge accessory to electronic device 308. For example, charge port 307 may be configured as a universal twelve-volt port for coupling a twelve-volt charge accessory operable to receive energy from a direct current energy source and convert the energy if needed to a level sufficient to charge electronic device 308. In this manner, several different types of charge accessories may be coupled to the universal twelve-volt charge port for charging electronic device 308.

In one embodiment, backpack 300 may include materials to protect environmental sensitive components of backpack 300. For example, one or more components may be sealed or laminated in a flexible material to provide sustained use adverse climate conditions. For example, liquid or water-resisting materials may be used to reduce the risk of device degradation and potential risks associated with electrical shock that may result from using backpack 300 in precipitating environments. For example, solar panels 304, 305, conductor 309, and electrical port 307 may be sealed with one or more types of sealing materials such as weather resistant polymers, silica or plastic sealants, shrink wrap materials, or other materials to isolate environmentally sensitive components.

In another embodiment, backpack 300 may include a solar panel cover (not expressly shown) of a material that substantially matches the color of backpack 300 to conceal the solar panels from plain view. For example, UV transmitting materials that allow select frequencies of light to be transmitted through the material to a solar panel may be used while concealing the solar panel from plain view. In this manner, select solar panels may be concealed using material substantially the same color as the main body of backpack 300. However, in other embodiments combinations of colors and material types may be used and integrated as a part of backpack to optimize performance, desired styling, and efficiency of backpack 300 as needed. Additionally, a UV transmitting material may be operable to allow incident light to be transmitted though the material and may further be operable to capture reflected light that may reflect off a portion of a solar panel. For example, a portion of the incident light may be reflected off of the surface of the solar panel surface and again reflected off of the back surface of the UV transmitting material. As such, solar energy that may not normally be captured may be reflected multiple times to the surface of each solar panel thereby increasing the efficiency solar energy conversion. In one embodiment, the UV transmitting material may include a backing material operable to help with reflecting solar energy back to the surface of the solar panel. For example, a thin film of reflective material may be coupled to the UV transmitting material and may allow for transmission of light in one direction (i.e. from the solar source) to the solar panel and reflect solar energy reflected from the solar panel back to the surface of the solar panel.

Figure 4:
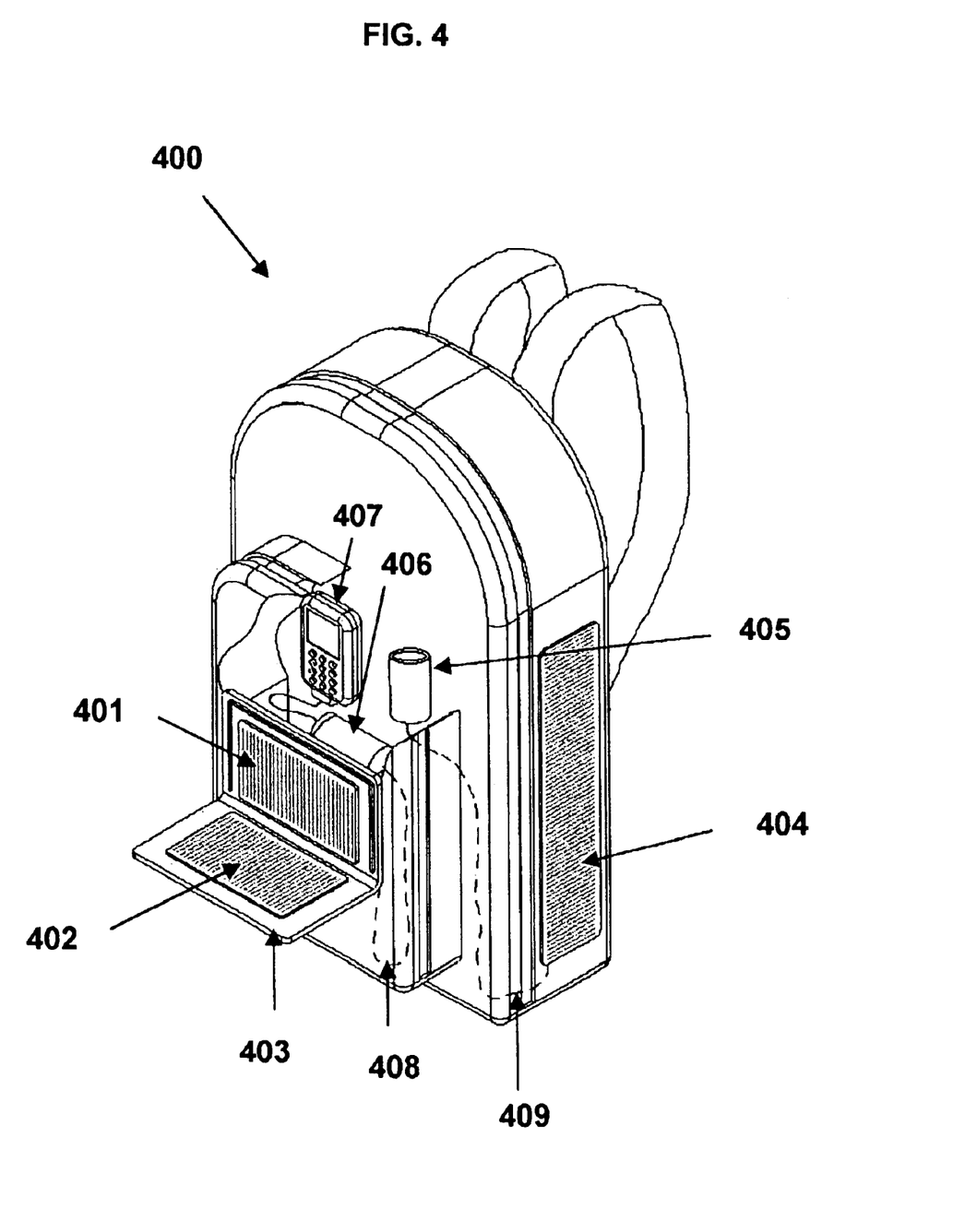
FIG. 4 illustrates a portable storage apparatus incorporating plural solar charge panels and charge ports according to one aspect of the invention.

FIG. 4 illustrates a portable storage apparatus incorporating plural solar charge panels and charge ports according to one aspect of the invention. A portable storage apparatus, illustrated generally as backpack 400, includes first and second solar panels 401 and 402 integrated as a part of a positional panel 403 coupled to an exterior portion of backpack 400. Backpack 400 further includes a third solar panel 404 is integrated as an exterior portion of backpack 400 and may include a flexible solar panel. First and second solar panels 401 and 402 are coupled to a first charge port 406 via conductor 408 for providing a charge to charge electronic device 407. Third solar panel 404 is coupled to second charge port 405 via second conductor 409. Second charge port 405 is operable as a universal twelve-volt charge port for charging an electronic device using a charge accessory (not expressly shown).

During use, solar energy is converted from each solar panel and coupled to an electronic device needing charging. Energy is converted by each solar panel and coupled to a respective charge port and may be used in a mobile setting obviating the need for remaining in a fixed location to charge an electronic device. Through providing third solar panel 404 as a flexible solar panel to a side portion of backpack 400, backpack 400 may be expanded, collapsed, and/or in a traditional manner. Additionally, through providing multiple solar panels and associated charge ports, several electronic devices may be charged using backpack 400 in a mobile setting.

Figure 5:
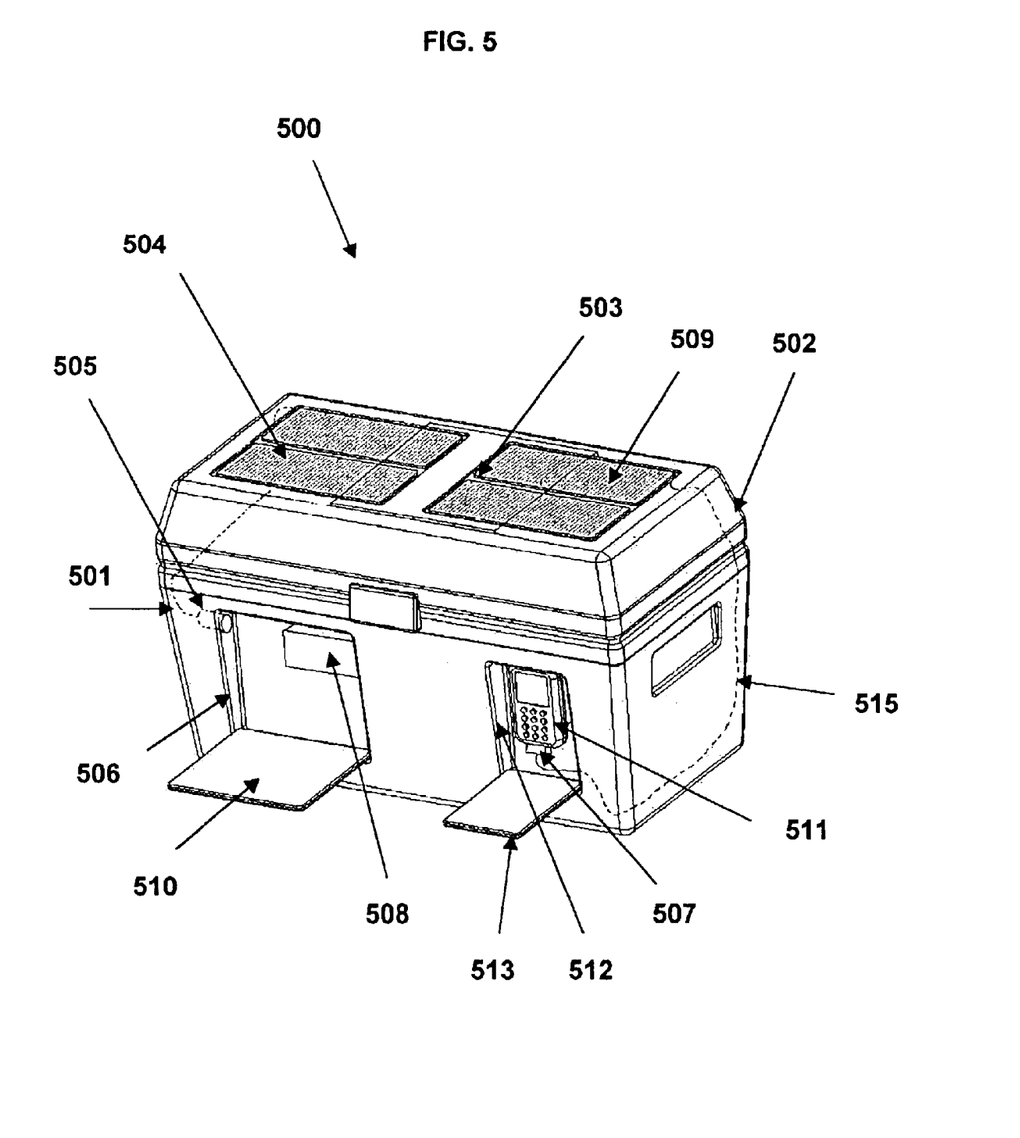
FIG. 5 illustrates a thermal storage apparatus incorporating a solar charge system according to one aspect of the invention.

FIG. 5 illustrates a thermal storage apparatus incorporating a solar charge system according to one aspect of the invention. A thermal storage apparatus, illustrated generally as thermal cooler 500, includes a first solar panel 504 and second solar panel 509 integrated as a part of top portion or lid 502 of thermal cooler 500. For example, lid 502 may include a plastic mold recess operable to house each solar panel and integrate each solar panel as a portion of lid 502. Each solar panel may be flush with the surface of the lid, or recessed below the top surface of the lid in a non-obtrusive manner. A removable and/or positional solar panel access panel 503 is coupled to lid 502 and provides access to solar panels 504 and 509. Thermal cooler 500 further includes a first charge port 505 coupled to a first side portion 506 of thermal cooler 500 and accessible via access panel 510. First charge port 505 may include a universal coupling port such as a universal port operable to allow coupling of a charge accessory for charging an electronic device (not expressly show). Thermal cooler 500 further includes a second charge port 507 having electrical contacts and coupling mechanisms operable to securely couple electronic devices having a specific contact specifications. Additionally, thermal cooler 500 may include a charge circuit (not expressly shown) between solar panels 504, 509 and charge ports 505 and 507. For example, a charge circuit may be operable to provide a specific level of energy converted by solar panel 504 and/or 509 to each charge port based on an electronic device's charge specification. For example, an electronic device may require a minimum charge of one hundred milliamps to sufficiently to charge the electronic device. As such, thermal cooler 500 may be configured to charge specific electronic devices having minimum charge specifications.

Thermal cooler 500 further includes charge port 507 and access panel 513 for storing an electronic device. For example, thermal cooler 500 may include a recess 512 and access panel 513 and may be used to store and to protect electronic device 511 from undesired bumping or jarring.

During operation, solar panel access panel 503 may be slid or removed to expose solar panel 504 and 509 to initiate conversion of solar energy into a direct current energy. For example, solar panel access panel 503 may be integrated as a part of lid 502 and coupled to a slide track (not expressly shown) to allow access to solar panels 504 and 509 when needed while providing protection of solar panels 504 and 509 when not being used.

Figure 7:
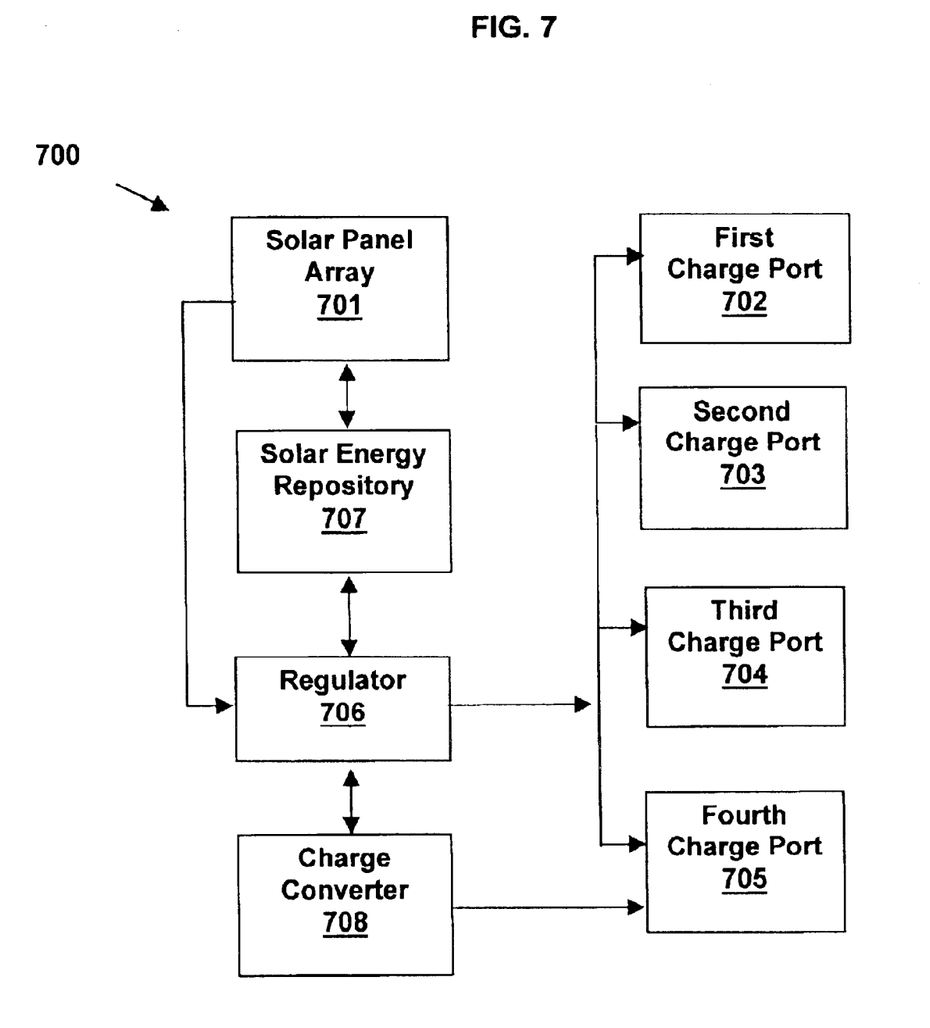
FIG. 7 illustrates a block diagram of a solar charge system according to one aspect of the invention.

Solar energy incident to solar panel 504 and/or 509 is converted to a direct current energy and coupled to charge port 504 via conductor 501 and to charge port 507 via conductor 515. In one embodiment, solar panel 504 may be used exclusively with charge port 505 to charge an electronic device and solar panel 509 may be used exclusively with charge port 507 to charge an electronic device. As such, solar panels 504 and 509 may be independently used to charge an electronic device using an associated charge port. However, in other embodiments, solar panels 504 and 509 may collectively convert solar energy and may be distributed to between each charge port as needed to charge an electronic device. FIG. 7 described below describes one embodiment of solar charge system operable to distribute energy between charge ports and may be incorporated as a part of thermal cooler 500.

In one embodiment, solar panel access panel 503 may be made of a material that allows transmission of solar energy to solar panels 504 and 509 while covering or protecting solar panels 504 and 509. For example, user may desire to set objects (i.e. drinks, cans, food, or other articles) on the top of thermal cooler 500. As such, through providing a material that allows for protection of solar panels 504 and 509 and further allows for transmission of solar energy to solar panels 504 and 509, cooler 500 may be used in a traditional manner without requiring special consideration.

In one embodiment, thermal cooler 500 may include a solar energy repository 508 operable to store converted solar energy. Solar energy repository 508 may be coupled to first solar panel 504 and/or second solar panel 509 and may store converted solar energy. For example, a user may use an electronic device in a mobile setting away from thermal cooler 500. As such, thermal cooler 500 may store converted energy within solar energy repository 508 and upon a user returning to thermal cooler 500, the user may couple an electronic device requiring charging to port 505 or 507 and energy stored within solar energy repository 508 may be used to charge the electronic device. Additionally, energy being converted from solar panels 504 and 509 may also be used with repository 508 to charge the electronic device. In this manner, a user may charge an electronic device using stored energy and actively converted solar energy thereby reducing the amount of time needed to charge the electronic device.

Thermal cooler 500 may be provided in an 'active on' mode of operation wherein solar energy is converted until repository 508 and/or an electronic device is fully charged and solar energy may not be converted unless a deficiency of energy exists within one and/or the other. For example, a detection circuit or blocking diode (not expressly shown) may be used to determine a charge level of the electronic device and or repository 508. As a battery for an electronic device is fully charged (i.e. minimum current is drawn to charge the battery), a detection circuit or blocking diode may isolate the electronic device and/or charge repository from solar panels 504 and 509 to reduce or minimize solar energy conversion and transverse currents that may deplete energy stored within the electronic device of repository 508. For example, as the charge level of the rechargeable battery of the electronic device exceeds the charge level of repository 508, current may be reversed do a higher relative charge level of the electronic device's battery relative to repository 508. Through providing a blocking diode or detection circuit, the current path between each battery may be limited based on the amount and direction of current passing between the electronic device and the charge system. In a further example, a blocking diode or detection circuit may be used to maintain a charge direction when a solar panel is not exposed to solar energy and is not converting energy sufficient to maintain a current output to charge the electronic device. Although some conventional solar panels or solar charge modules may include bypass diodes integrated as a part of the solar panel or solar module, it may be necessary to include additional detection circuits or blocking diodes to minimize undesired transverse or reverse current situations that may deplete energy stored within the electronic device. In this manner, solar energy may only be converted if used to charge an electronic device or charge repository.

Figure 6A:
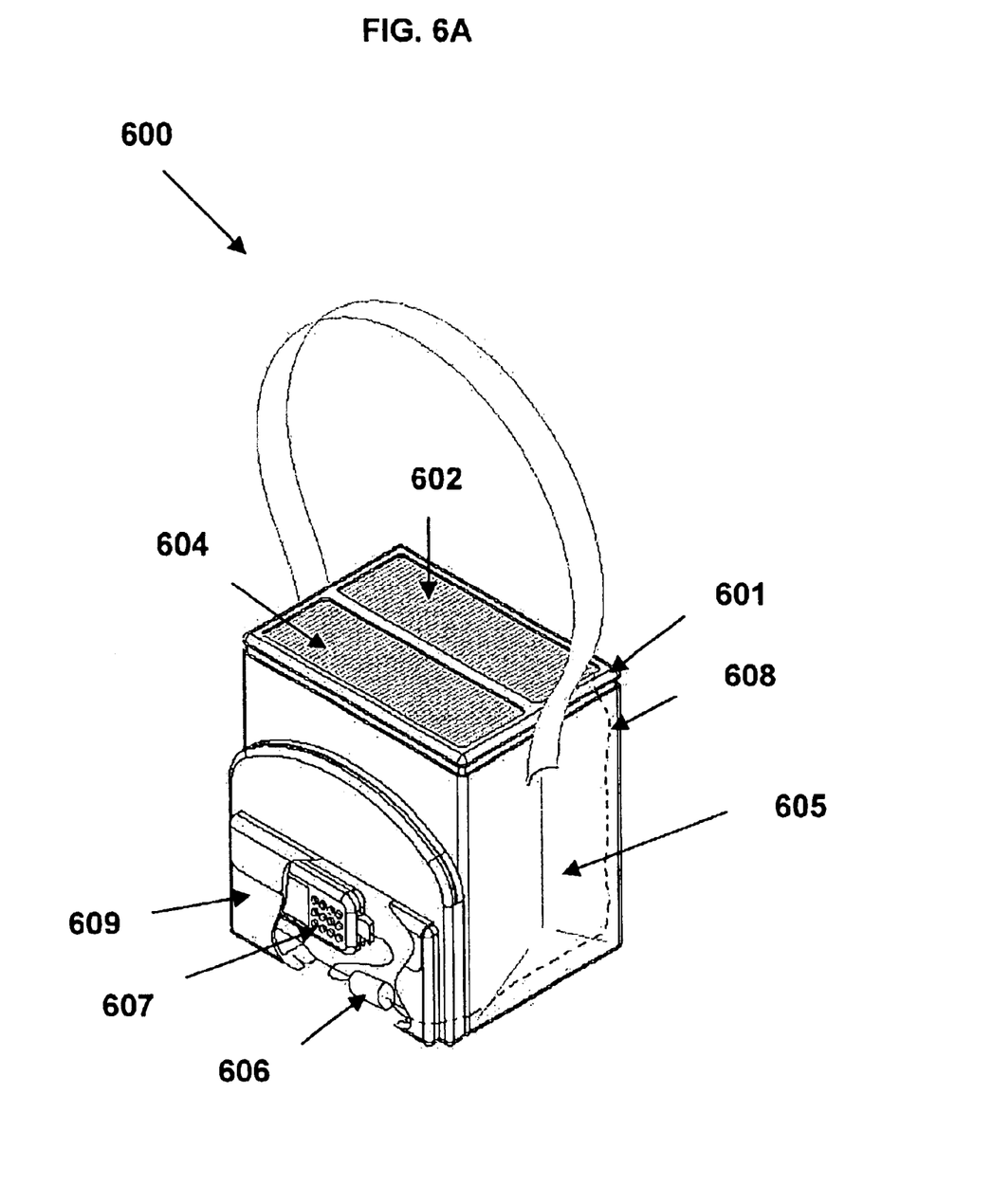
FIG. 6A illustrates a collapsible solar storage apparatus in an expanded position according to one aspect of the invention.

FIG. 6A illustrates a collapsible solar storage apparatus in an expanded position incorporating a solar charge system according to one aspect of the invention. Collapsible solar storage apparatus, illustrated generally as collapsible cooler 600, includes a first solar panel 602 and second solar panel 604 integrated as a part an upper portion 601 of collapsible cooler 600. Each solar panel may be integrated through providing a cavity or recess (not expressly shown) for housing each solar panel in a non-obtrusive manner. For example, upper portion 601 may include a cavity made of substantially the same materials as collapsible cooler 600 to integrate each solar panel as a portion of upper portion 601. Collapsible cooler 600 further includes a cooler cavity 605 for storing articles, and maintaining a thermal state (i.e. hot, warm, cold, etc.). Collapsible cooler 600 includes a charge port 606 operable to couple electronic device 607 stored within side storage compartment 609. For example, a user may couple a cellular phone to charge port 606 to charge the cellular phone's rechargeable battery using a direct current energy provided by solar panels 602 and 604 via conductor 608. Solar panels 602 and 604 may include rigid or flexible solar panels and may be sized to provide a desired solar energy conversion rate sufficient to charge electronic device 607.

Figure 6B:
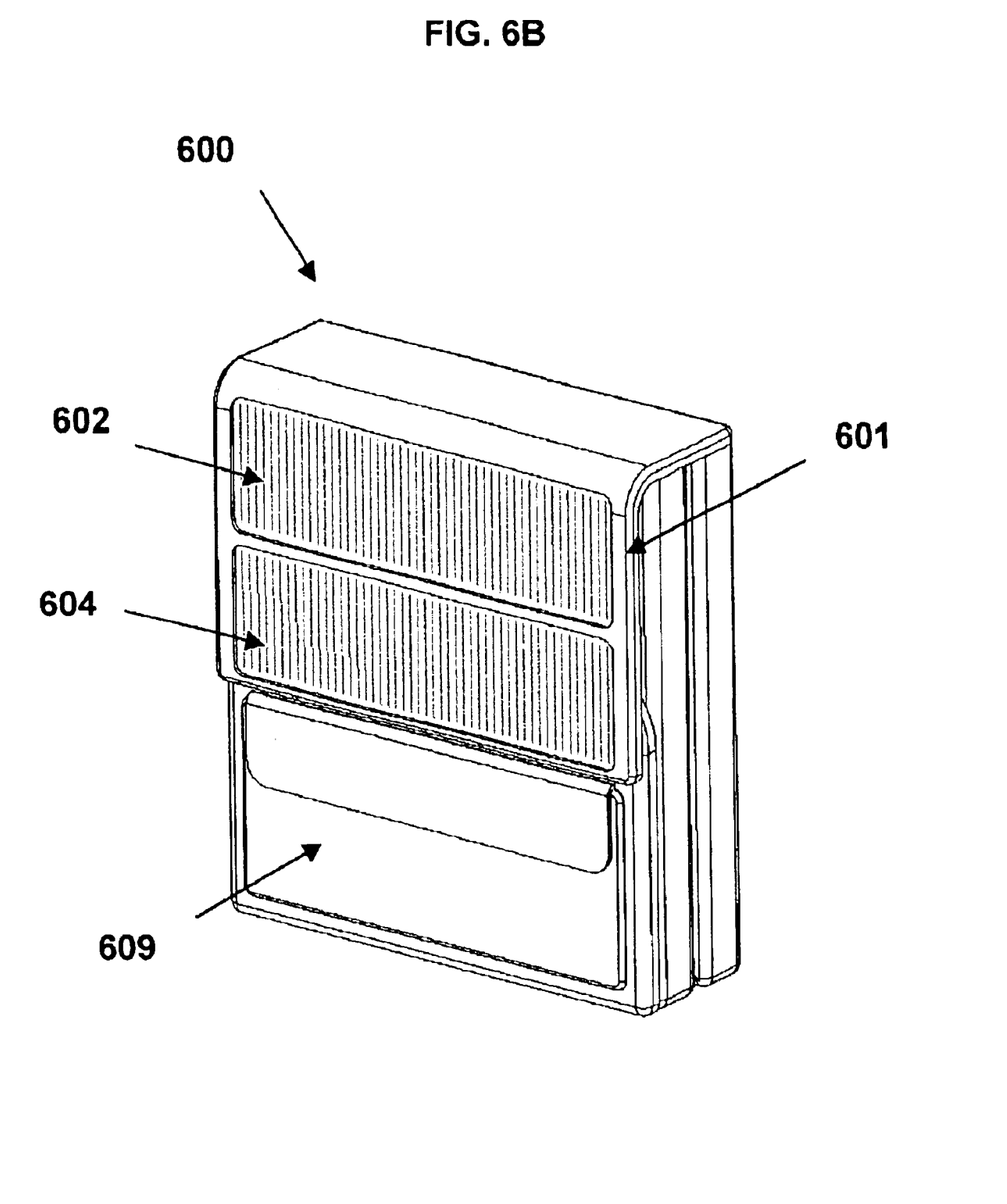
FIG. 6B illustrates a collapsible solar storage apparatus in a collapsed position incorporating a solar charge system according to one aspect of the invention.

FIG. 6B illustrates collapsible cooler 600 in a collapsed or compacted position. Collapsible cooler 600 may be collapsed or compacted such that solar panels 602 and 604 remain exposed to solar energy to convert energy as needed. Additionally, upper portion 601 is folded in a downward position and extends to the top portion of side storage compartment 609 and allows for access to storage compartment 609 operable to house electronic device 607 and charge port 606. In this manner, electronic device 607 may be accessed and charged as needed when cooler 600 is placed in either an expanded or collapsed position.

FIG. 7 illustrates a block diagram of a solar charge system according to one aspect of the invention. Solar charge system, illustrated generally at 700, includes a solar panel array 701 and a first charge port 702, a second charge port 703, a third charge port 704 and a fourth charge port 705. Each charge port may include a blocking diode operable to restrict current from being reversed to regulator 706 and a fuse or current limiting element operable to limit the amount of current coupled to each port. A solar energy repository 707 is coupled between regulator 706 and solar panel array 701 and is operable to store energy converted by solar panel array 701. A charge converter 708 is coupled to regulator 706 and fourth charge port 705 and provides a specific charge level to fourth charge port 705 as needed. Regulator 706 is coupled to each charge port and is operable as a solar energy regulator and distribution module operable to provide direct current energy for charging plural electronic devices. Regulator 706 may include a current limiting element for each output port and may also include blocking diodes for eliminating reverse current conditions that may be present from time to time as each electronic device is charged.

During use, system 700 converts solar energy to direct current energy using solar panel array 701 which may include several solar panels or modules operable to convert solar energy to a direct current energy. Each solar panel or module associated with solar panel array may be integrated as a part of a portable storage apparatus (not expressly shown) for actively converting solar energy in a mobile environment. Solar panel array 701 converts solar energy to direct current energy and couples the converted energy to solar energy repository 707 and regulator 706.

Regulator 706 may be used to combine the outputs of several solar panels or modules and couple the converted energy to each port as needed. For example, each port may be configured to output fifty watts of power to charge an electronic device. As such, regulator 706 may couple fifty watts of power to each port. Similarly, each port may include different specifications for charging an electronic device. For example, first charge port may be operable to output 30 watts at 500 millivolts, second output port may be operable to output 40 watts at six volts, and third output port may be operable to output 50 watts at twelve volts. As such, regulator 706 ensures that each output level is maintained through coupling energy to each charge port. For example, regulator 706 may include a voltage and/or current divider operable to facilitate outputting an associated output level to each port using energy converted by solar panel array 701.

In one embodiment, regulator 706 may include a detection circuit to detect when an electronic device is coupled to each port and distribute energy between each active port to ensure a minimum output level is provided for each port. A detection circuit may include a feedback circuit operable to detect when the impendence of each port is altered couple or remove an output accordingly. Additionally, regulator 706 may also distribute excess energy to solar energy repository 707 operable to store converted solar energy. In one embodiment, when an electronic device is not coupled to a port or has been sufficiently charged, regulator 706 may divert converted energy to solar energy repository 707 to store energy as needed.

Regulator 706 may also be preprogrammed and/or reprogrammed to output specific power levels to each charge port.

For example, regulator 706 may include a processor and digitally encoded control circuit logic (not expressly shown) operable to access a memory device such as a ROM, EEPROM, Flash memory, etc. operable to provide a specification for each charge port. Regulator 706 may then use the specification and an associated programmable voltage divider to provide a desired output to a specific charge port. As such, specifications for each port may be provided within a programmable memory and updated through reprogramming memory to provide a new specification.

Figure 8A:
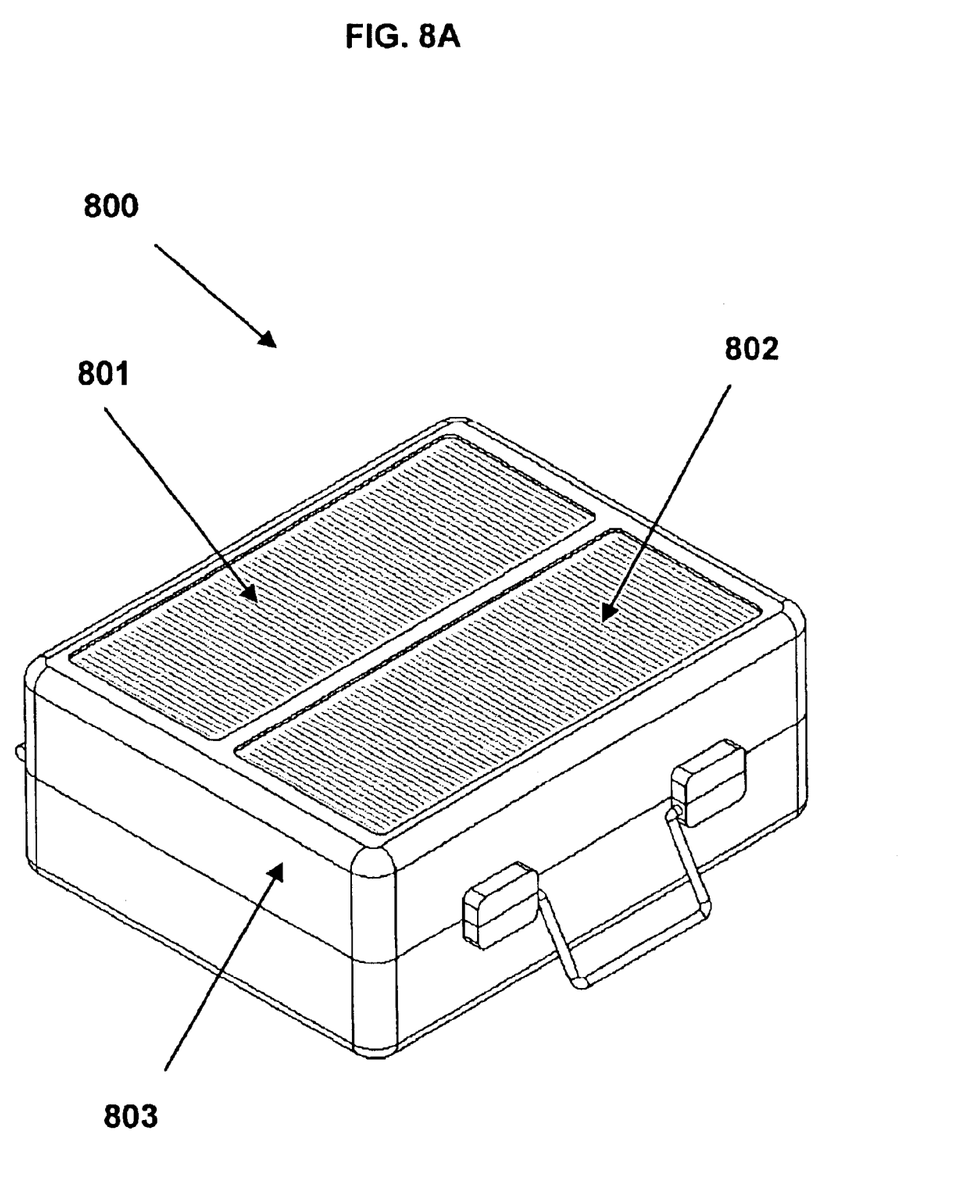
FIG. 8A illustrates a diagram of a portable multi-port solar charge system in a closed position according to one aspect of the invention.

FIG. 8A illustrates a diagram of a portable multi-port solar charge system in a closed position according to one aspect of the invention. A portable multi-port solar charge system, illustrated generally as a storage apparatus 800, includes a first solar panel module 801 and second solar panel module 802 integrated as a portion of a lid 803. Each solar panel module may include a rigid solar panel module or flexible solar panel module and may be operable to output one or more levels of converted energy. For example, each panel may be configured to output up to fifty watts of power.

Each solar panel is integrated as a part of lid 803 through providing a recess or cavity as a part of lid 803. For example, lid 803 may include a molded recess to allow for holding each solar panel in a non-obtrusive manner. Each solar panel may be held using mounting mechanism (not expressly shown) such as brackets, screws and nuts, or adhesive materials operable to mount a solar panel to storage apparatus 800. Additionally, each panel may include a protective material coupled to a back portion of each solar panel to protect each solar panel from the rough handling and the elements. For example, each solar panel may include a shock absorbing material or cushion material coupled to the back portion in addition to a plastic material or polymer for protection from the elements.

Figure 8B:
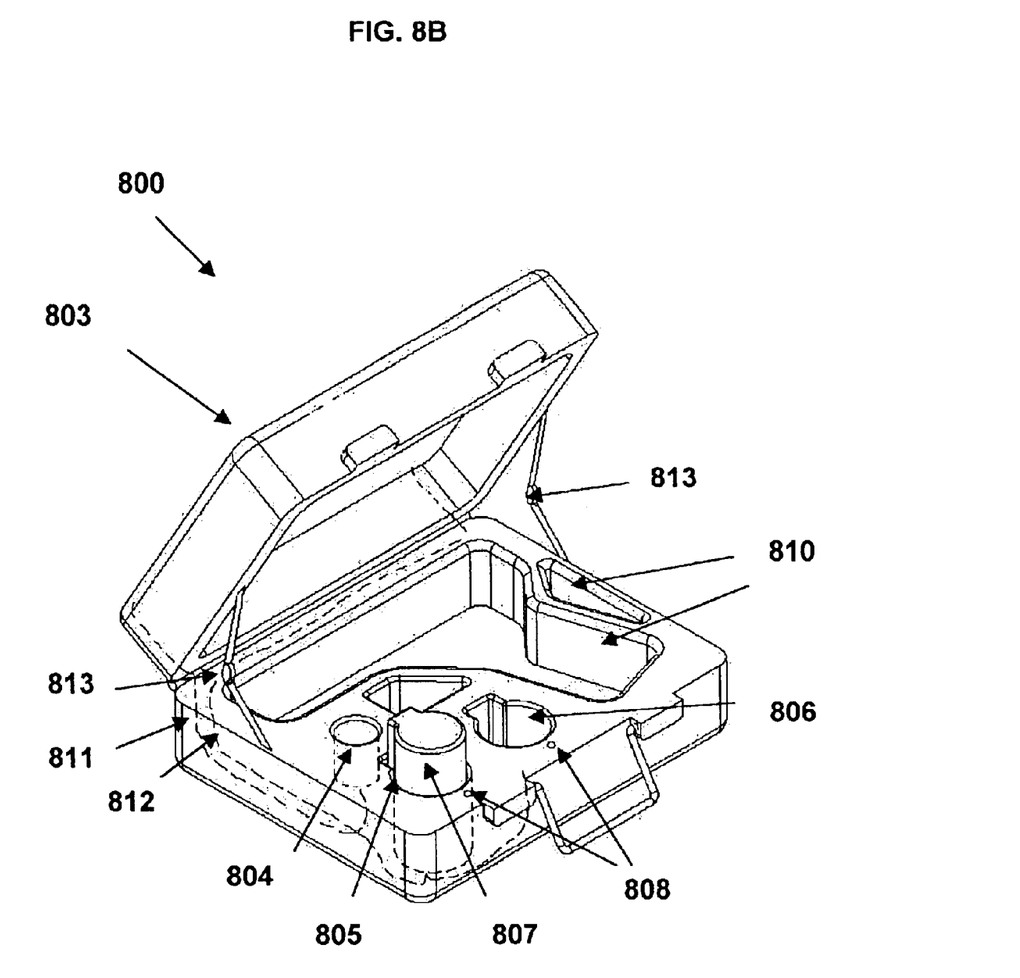
FIG. 8B illustrates a diagram of a portable multi-port solar charge system in an expanded position according to one aspect of the invention.

FIG. 8B illustrates a diagram of a portable multi-port storage apparatus in an expanded or open position and includes a storage areas or cavities 810 for storing an electronic device such as a cordless drill or other accessories and a first charge port 804 configured as a universal twelve-volt charge port, second and third charge ports 805 and 806 operable to receive a rechargeable battery. Each charge port may include a status indicators 808 to indicate a charge status of an electronic device or battery.

Each charge port is coupled to first and second solar panel module 801 and 802 via first and second conductors 811 and 812. Each charge port may be directly coupled to each solar panel array to obtain a charge directly from each solar panel module. For example, second charge port 805 may be connected in parallel with third charge port 806 and further coupled to first solar panel module 801. Additionally, second solar panel module 802 may be directly coupled to universal twelve volt charge port 804 for charging an electronic device. However, other embodiments may include incorporating solar charge system 700 of FIG. 7 for charging an electronic device or battery.

During use, a user may couple an electronic device to first charge port 804 and may further plug battery 807 into second charge port 805 for charging. Lid 803 may be rotated to an optimum position to facilitate charging an electronic device or battery. For example, lid 803 may be rotated and fixed to optimize solar energy incident to lid 803 and may include a positional element 813 to fix the angle of lid 803 relative to incident solar energy. Status indicators 808 may also be used in association with positioning lid 803 and may illuminate brighter or dimmer based on the amount of energy being converted by first and second solar panel modules 802 and 803. Each electronic device or battery is charged using converted solar energy and upon being charged completely, status indicator may detect the level of current being drawn by the electronic device or battery and illuminate green to indicate that a full charge has been achieved. Additionally, each charge port may include current limiting elements and blocking diodes to protect from excessive currents or reverse current conditions.

Figure 9:
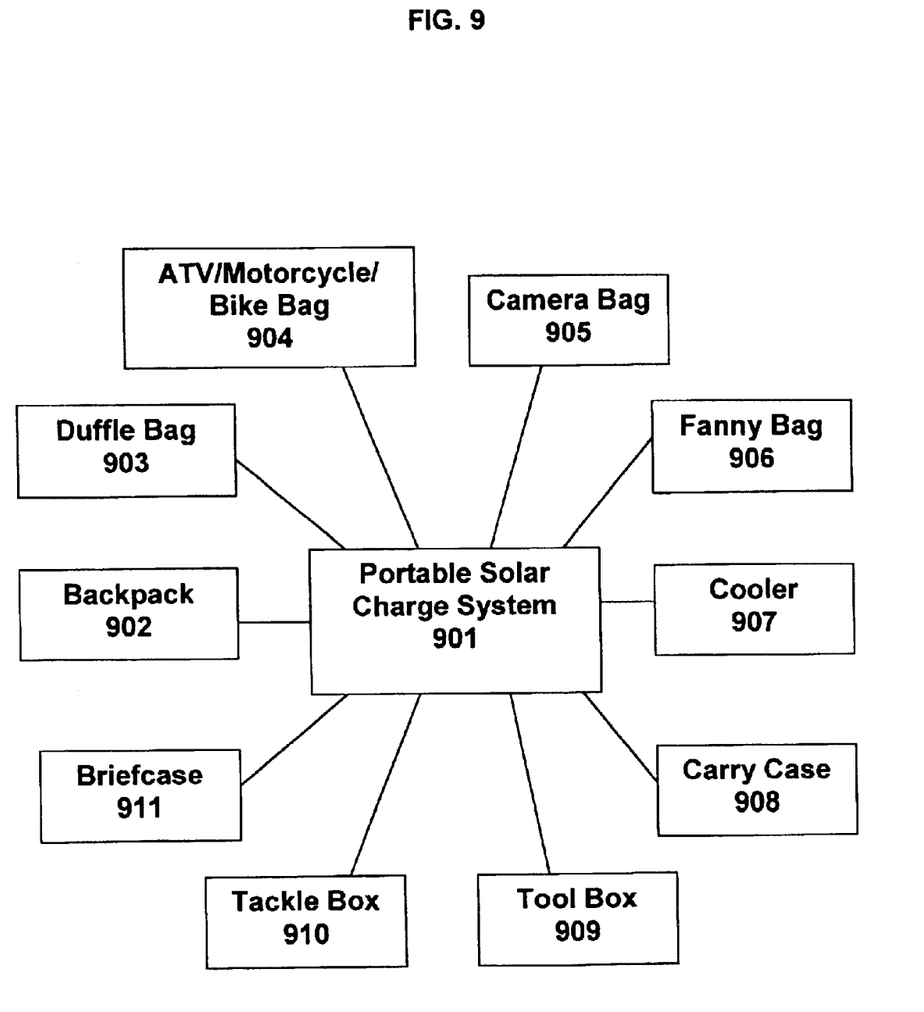
FIG. 9 illustrates several embodiments for incorporating a solar charge system as a part of a portable storage apparatus according to one aspect of the invention.

FIG. 9 illustrates several embodiments for incorporating a solar charge system as a part of a portable storage apparatus according to one aspect of the invention. Portable solar charge system 901 may be integrated as a part of a backpack 902, a duffle bag 903, a saddle bag 904 for a motorcycle, motorized bike, or all terrain vehicle (ATV), a camera bag 905, a 'fanny bag' 906 operable to be coupled around a person's waist, a cooler 907, a carry case 908 such as a computer bag for storing a laptop computer or for storing power tools, a toolbox 909, or a tackle box 910. Additionally, several other types of portable storage apparatuses may take advantage of integrating a portable solar charge system 901 for use in a mobile environment. As such, portable solar charge system 901 may be integrated as a portion of a portable storage apparatus for charging an electronic device stored within the portable storage apparatus. Solar energy may be converted to direct current energy allowing for a user to charge an electronic device in a mobile environment when terrestrial and/or conventional energy sources may not be available.

Although the disclosed embodiments have been described in detail, it should be understood that various changes, substitutions and alterations can be made to the embodiments without departing from their spirit and scope.

What is claimed is:

1. A portable storage apparatus for charging an electronic device comprising:
   at least one solar panel intergrated as a part of an exterior surface of a storage apparatus operable to store an electronic device;
   a conductive element electrically coupled between the at least one solar panel and a universal twelve-volt charge port, the universal twelve-volt charge port operable to couple converted solar energy to charge a rechargeable battery of the electronic device; and a layer of material, not directly coupled to the solar panel, covering the solar panel and coupled to the material of the exterior surface.

2. The apparatus of claim 1 further comprising a second solar panel coupled to an interior portion of the storage apparatus.

3. The apparatus of claim 1 wherein the solar panel comprises a flexible solar panel.

4. The apparatus of claim 1 further comprising plural charge ports electrically coupled to the at least one solar panel, at least one the charge ports being accessible via an interior portion of the storage apparatus.

5. The apparatus of claim 1 wherein the layer of material is a liquid resisting material.

6. The apparatus of claim 1 further comprising a backpack as the portable storage apparatus.

7. The apparatus of claim 1 further comprising a thermal cooler as the portable storage apparatus.

8. The apparatus of claim 7 wherein the thermal cooler comprises a collapsible thermal cooler.

9. The apparatus of claim 1 further comprising a second charge port operable to receive a rechargeable battery and operably associated with a charge status indicator for providing a charge status of the rechargeable battery.

10. A portable solar charge system for charging an energy source associated with an elctronic device comprising:
- at teast one flexible solar panel integrated as a part of an exterior surface of a storage apparatus operable to store an electronic device;
- at least one charge port electrically coupled to the at least one flexible solar panel to provide converted solar energy to charge the energy source; and a layer of material, not directly coupled to the solar panel, covering the solar panel and coupled to the material of the exterior surface.

11. The system of claim 10 further comprising a second positional solar panel coupled to an exterior portion of the storage apparatus.

12. The system of claim 10 further comprising a second solar panel coupled to an interior portion of the storage apparatus.

13. The system of claim 10 further comprising at least one universal twelve-volt charge port coupled to an interior portion of the storage apparatus.

14. The system of claim 10 further comprising a device specific charge port operably associated with a charge circuit to provide sufficient energy converted by the flexible solar panel and based on the device specification.

15. The system of claim 10 further comprising the at least one charge port accessible external to the storage apparatus.

16. The system of claim 10 further comprising a battery port operable to receive a rechargeable battery associated with an electronic device, the battery port electrically coupled to the flexible solar panel to provide converted solar energy to charge the rechargeable battery.

17. The system of claim 10 further comprising a rigid solar panel.

18. The system of claim 10 further comprising the solar energy repository coupled to the flexible solar panel, the repository operable to store solar energy.

19. The system of claim 18 further comprising the solar energy repository electrically coupled to the at least one charge port to provide the converted solar energy.

20. The system of claim 17 further comprising a regulator coupled between the flexible and rigid solar panels and the at least one charge port, the regulator operable to regulate energy provided by the flexible and rigid solar panels to the at least one charge port.

21. The system of claim 10 further comprising:
- a universal twelve-volt charge port directly coupled to the flexible solar panel via a conductor; and
- a device specific charge port coupled to a charge circuit operable to convert energy provided by the flexible solar panel based on a specification of the electronic device.

22. The system of claim 10 further comprising:
- means for coupling converted solar energy to a charge accessory operable associated with charging a battery; and
- means for converting the solar energy to an electrical energy sufficient to charge the battery.

23. The system of claim 10 further comprising a solar energy regulator and distribution module coupled between a solar panel array and plural charge ports, the module operable to couple different output levels to each port charging electronic devices.

24. A backpack operable to charge a battery associated with an electronic device comprising:
- a storage space for storing an electronic device, the storage space including an interior portion and an exterior portion;
- a first flexible solar panel integrated as a part of the exterior portion;
- a second positional solar panel coupled to a portion of the interior portion of the backpack; and
- a universal 12-volt charge port electrically coupled to the first and second solar panels, the universal 12-volt charge port operable to actively provide solar energy to charge the electronic device while the backpack is being used within a mobile environment.

* * * * *